United States Patent
Sato et al.

(10) Patent No.: US 7,172,681 B2
(45) Date of Patent: Feb. 6, 2007

(54) PROCESS FOR PRODUCING RUBBER-BASED COMPOSITE MATERIAL

(75) Inventors: Kenji Sato, Kodaira (JP); Yoshinori Iwabuchi, Kodaira (JP); Masato Yoshikawa, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 131 days.

(21) Appl. No.: 10/771,117

(22) Filed: Feb. 4, 2004

(65) Prior Publication Data

US 2004/0173305 A1    Sep. 9, 2004

(30) Foreign Application Priority Data

| Feb. 5, 2003 | (JP) | ............................. 2003-028621 |
| Feb. 5, 2003 | (JP) | ............................. 2003-028632 |
| Feb. 5, 2003 | (JP) | ............................. 2003-028634 |
| May 28, 2003 | (JP) | ............................. 2003-150148 |

(51) Int. Cl.
   *C23C 14/34*    (2006.01)

(52) U.S. Cl. ..................... 204/192.14; 204/192.12; 204/192.13; 156/281

(58) Field of Classification Search ............... 156/281; 204/192.12, 192.14, 192.13
   See application file for complete search history.

(56) References Cited

U.S. PATENT DOCUMENTS

| 3,985,635 | A | * | 10/1976 | Adam et al. ............ 204/298.11 |
| 4,166,784 | A | * | 9/1979 | Chapin et al. .......... 204/192.13 |
| 4,407,709 | A | * | 10/1983 | Enjouji et al. ........... 204/192.13 |
| 4,917,963 | A | * | 4/1990 | Kittler ........................ 428/610 |
| 5,403,419 | A | * | 4/1995 | Yoshikawa et al. ......... 156/151 |
| 5,454,919 | A | * | 10/1995 | Hill et al. ............... 204/192.11 |
| 6,193,835 | B1 | * | 2/2001 | Yoshikawa et al. ......... 156/281 |

FOREIGN PATENT DOCUMENTS

| EP | 0230652 | * | 12/1986 |
| JP | 62-189117 A | | 8/1987 |
| JP | 2002-172721 A | | 6/2002 |

OTHER PUBLICATIONS

Affinito et al. "Mechanisms of voltage controlled, reactive, planar magnetron sputtering of Al in Ar/N2 and Ar/O2 atmospheres", J. Vac. Sci.Techno. A2(3) Jul.-Sep. 1984, pp. 1275-1284.*

* cited by examiner

*Primary Examiner*—Rodney G. McDonald
(74) *Attorney, Agent, or Firm*—Sughrue Mion, PLLC

(57) ABSTRACT

Disclosed is a process for producing a rubber-based composite material, including the steps of forming, by sputtering, an adhesion film on a substrate to be mated with a rubber for constituting the composite material, laminating a rubber composition on the adhesion film, and vulcanizing the rubber composition, the sputtering is conducted by using a first target and a second target, composed of different metallic components and provided in a chamber, while moving the substrate in sputtering atmospheres formed by applying electric power simultaneously to the first and second targets. Also disclosed is a process for producing a rubber-based composite material, including the steps of forming, by sputtering, an adhesion film on a substrate to be mated with a rubber for constituting the composite material, laminating a rubber composition on the adhesion film, and vulcanizing the rubber composition, wherein the sputtering is conducted by using a plurality of targets, composed of metals or metallic compounds containing different metallic elements and provided in a chamber, while rotating the substrate in sputtering atmospheres formed by applying electric power simultaneously to the targets.

25 Claims, 7 Drawing Sheets

PROCESS FOR PRODUCING RUBBER-BASED COMPOSITE MATERIAL

BACKGROUND OF THE INVENTION

The present invention relates to a process for producing a rubber-based composite material including a substrate and a rubber joined to each other, and particularly to a process for producing a rubber-based composite material by forming an adhesion film on a substrate to be mated with a rubber for constituting the composite material, and laminating a rubber composition on the adhesion film and vulcanizing the rubber composition.

As a composite material including a rubber joined to a substrate such as a metal, a ceramic, a plastic, etc. which is used, for example, as a reinforcing member in tires, belts or the like, there are those in which a substrate and a rubber are joined to each other by vulcanizing and press bonding a rubber composition to the substrate. In these composite materials, not only the characteristics of the substrate and the rubber but also the adhesion between the substrate and the rubber affects greatly the characteristics of the composite material. Such rubber-based composite materials are required to show a high adhesive strength immediately after adhesion and after a long lapse of time.

As a process for producing a rubber-based composite material as above-mentioned, there are known, for example, methods of producing a rubber-plastic composite material in which a thin film of a metal or a metallic compound is formed on the surface of a plastic substrate, and a rubber composition is vulcanized and press bonded using the thin film as an adhesion film (see, for example, JP-A 62-189117 and JP-A 2002-172721).

In these methods, however, it is impossible to impart a strong adhesiveness to both the substrate and the rubber, and, therefore, the adhesive force has been insufficient between the substrate and the adhesion film and/or between the adhesion film and the rubber. In order to solve this problem, there has been proposed a method in which two adhesion films are used. In this case, on the contrary, good adhesion is required also between the two adhesion films. Accordingly, these rubber-based composite materials have been unsatisfactory as to initial adhesion performance, durability of adhesion, and storage stability.

In addition, the above-mentioned patent references report also the use of an alloy adhesion film, in which an alloy composed of the metal components is used as a target. In the case of such rubber-based composite materials, the metallic composition of the adhesion film or films should be varied according to the kinds of the substrate and the rubber. For this purpose, it is necessary to prepare a multiplicity of alloys differing in composition and to replace the target each time for providing the adhesion film with the desired composition. However, in order to replace the target, it is necessary to break the vacuum pressure each time. In this case, it is also necessary to prevent the outside air from being mixing into or remaining in the chamber at the time of replacing the target. Therefore, the target replacing operation would be extremely complicated and inefficient. Accordingly, it has been difficult to optimize the metallic composition of an adhesion film containing a plurality of metallic components according to the kinds of the substrate and the rubber.

SUMMARY OF THE INVENTION

The present invention has been made in consideration of the above circumstances. Accordingly, it is an object of the present invention to provide a process for producing a rubber-based composite material including a substrate and a rubber joined to each other which is excellent in adhesion performance between the substrate and the rubber, particularly in initial adhesion performance, durability of adhesion and storage stability, and particularly to provide a process by which a rubber-based composite material having good adhesion performance between a substrate and a rubber can be produced efficiently.

The present inventors have made intensive and extensive investigations in order to attain the above object. As a result of their investigations, the present inventors have found out that, when a rubber-based composite material is produced by forming an adhesion film on a substrate to be mated with a rubber for constituting the composite material by sputtering which is conducted by using a first target and a second target, composed of different metallic components and provided in a chamber, while moving the substrate from the first target side toward the second target side, in sputtering atmospheres formed by applying electric power simultaneously to the first and second targets, and laminating a rubber composition on the adhesion film, and vulcanizing the rubber composition, it is possible to form an adhesion film having a gradient of metallic composition in the thickness direction thereof, and the adhesion film differs in composition on the substrate side and on the rubber side, so that each of the substrate and the rubber is provided with a strong adhesive force, and the rubber-based composite material including the substrate and the rubber mated with each other through the adhesion film has a firmly adhered structure with excellent initial adhesion performance, durability of adhesion, and storage stability. Based on the finding, the first invention described below has been made.

In addition, the present inventors have found out that, when a rubber-based composite material is produced by forming an adhesion film on a substrate to be mated with a rubber to constitute the composite material by sputtering which is conducted by using a first target and a second target, composed of different metallic components and provided respectively in a first compartment and a second compartment of a chamber including the first and second compartments communicated with each other through a communication port, while moving the substrate from the first target side toward the second target side through the communication port, in sputtering atmospheres formed by supplying reactive gases with different compositions respectively into the first and second compartments and applying electric power simultaneously to the first and second targets, and laminating a rubber composition on the adhesion film, and vulcanizing the rubber composition, it is possible to form an adhesion film having a gradient of composition of the components derived from the metallic components and the reactive gases in the thickness direction thereof, and the adhesion film differs in composition on the substrate side and on the rubber side, so that each of the substrate and the rubber is provided with a strong adhesive force, and the rubber-based composite material including the substrate and the rubber mated with each other through the adhesion film has a firmly adhered structure with excellent initial adhesion performance, durability of adhesion, and storage stability.

In this case, it has further been found out that, when the sputtering is conducted by using plasma light emission detectors provided respectively in the first and second compartments while performing a plasma light emission monitor control for controlling the quantities of the reactive gases supplied into the first and second compartments so as to keep constant the light emission quantities detected by the plasma light emission detectors and/or an impedance control for controlling the quantities of the reactive gases supplied into the first and second compartments according to the voltage between the first or second target and earth, so as thereby to optimize the quantities of the reactive gases supplied into the first and second compartments, the sputtering atmospheres are stabilized, and it is possible to obtain a uniform adhesion film which is stable in the gradient of composition, particularly, the gradient of composition of the components derived from the reactive gases. It has also been found out that, when the first and second compartments are provided with respective exhaust ports and the sputtering is conducted while exhausting the gases simultaneously through the exhaust ports, it is possible to prevent the reactive gases supplied respectively into the first and second compartments from being mixed with each other to an excessive extent through the communication port, and to stably produce an adhesion film having the gradient of composition. Based on the findings, the second invention described below has been made.

Further, the present inventors have found out that, when a rubber-based composite material is produced by forming an adhesion film on a substrate to be mated with a rubber for constituting the composite material by sputtering which is conducted by using a first target and a second target, composed of different metallic components and provided in a chamber supplied with a reactive gas, while moving the substrate from the first target side toward the second target side in magnetron sputtering atmospheres formed by applying electric power to the first and second targets on the basis of a dual cathode system, and laminating a rubber composition on the adhesion film, and vulcanizing the rubber composition, it is possible to form with good productivity an adhesion film having a gradient of metallic composition in the thickness direction thereof and having less defects as compared with an adhesion film obtained by use of a DC power source, and the adhesion film differs in composition on the substrate side and on the rubber side, so that each of the substrate and the rubber is provided with a strong adhesive force, and the rubber-based composite material including the substrate and the rubber mated with each other through the adhesion film has a firmly adhered structure with excellent initial adhesion performance, durability of adhesion, and storage stability. Based on the finding, the third invention described below has been made.

Furthermore, the present inventors have found out that, when a rubber-based composite material is produced by forming an adhesion film on a substrate to be mated with a rubber for constituting the composite material by sputtering which is conducted by using a plurality of targets, composed of metals or metallic compounds containing different metallic elements and provided in a chamber, while rotating the substrate in sputtering atmospheres formed by applying electric power simultaneously to the targets, and laminating a rubber composition on the adhesion film, and vulcanizing the rubber composition, it is possible to easily vary the composition of the adhesion film containing the plurality of metallic elements according to the kinds of the substrate and the rubber without replacing the targets each time of the variation, and to efficiently produce a rubber-based composite material having high adhesion performance between a substrate and a rubber. Based on the finding, the fourth invention described below has been made.

In accordance with the first invention of the present invention, there is provided a process for producing a rubber-based composite material, including the steps of forming, by sputtering, an adhesion film on a substrate to be mated with a rubber for constituting the composite material, and laminating a rubber composition on the adhesion film, and vulcanizing the rubber composition, wherein the sputtering is conducted to form the adhesion film by using a first target and a second target, composed of different metallic components and provided in a chamber, while moving the substrate from the first target side toward the second target side in a sputtering atmosphere formed by applying electric power simultaneously to the first and second targets.

According to the first invention, it is possible to form an adhesion film having a gradient of metallic composition in the thickness direction thereof, and the adhesion film differs in composition on the substrate side and on the rubber side, so that each of the substrate and the rubber is provided with a strong adhesive force, and it is possible to produce a rubber-based composite material having a firmly adhered structure with excellent initial adhesion performance, durability of adhesion, and storage stability.

In accordance with the second invention of the present invention, there is provided a process for producing a rubber-based composite material, including the steps of forming, by sputtering, an adhesion film on a substrate to be mated with a rubber for constituting the composite material, and laminating a rubber composition on the adhesion film, and vulcanizing the rubber composition, wherein the sputtering is conducted to form the adhesion film by using a first target and a second target, composed of different metallic components and provided respectively in a first compartment and a second compartment of a chamber including the first and second compartments communicated with each other through a communication port, while moving the substrate from the first target side toward the second target side through the communication port in sputtering atmospheres formed by supplying reactive gases with different compositions respectively into the first and second compartments and applying electric power simultaneously to the first and second targets.

According to the second invention, it is possible to form an adhesion film having a gradient of composition of the components derived from the metallic components and the reactive gases in the thickness direction thereof, and the adhesion film differs in composition on the substrate side and on the rubber side, so that each of the substrate and the rubber is provided with a strong adhesive force, and it is possible to produce a rubber-based composite material having a firmly adhered structure with excellent initial adhesion performance, durability of adhesion, and storage stability.

In accordance with the third invention of the present invention, there is provided a process for producing a rubber-based composite material, including the steps of forming, by sputtering, an adhesion film on a substrate to be mated with a rubber for constituting the composite material, and laminating a rubber composition on the adhesion film, and vulcanizing the rubber composition, wherein the sputtering is conducted to form the adhesion film by using a first target and a second target, composed of different metallic components and provided in a chamber, while moving the substrate from the first target side toward the second target side in magnetron sputtering atmospheres formed by supplying a reactive gas into the chamber and applying electric power to the first and second targets on the basis of a dual cathode system.

According to the third invention, it is possible to form an adhesion film having a gradient of metallic composition in the thickness direction thereof, and the adhesion film differs in composition on the substrate side and on the rubber side, so that each of the substrate and the rubber is provided with a strong adhesive force, and it is possible to produce a rubber-based composite material having a firmly adhered structure with excellent initial adhesion performance, durability of adhesion, and storage stability.

In accordance with the fourth invention of the present invention, there is provided a process for producing a rubber-based composite material, including the steps of forming, by sputtering, an adhesion film containing a plurality of metallic elements on a substrate to be mated with a rubber for constituting the composite material, and laminating a rubber composition on the adhesion film, and vulcanizing the rubber composition, wherein the adhesion film is formed by the sputtering which is conducted by using a plurality of targets, composed of metals or metallic compounds containing different metallic elements and provided in a chamber, while rotating the substrate in sputtering atmospheres formed by applying electric power simultaneously to the targets.

In this case, by varying the electric power applied to the individual targets, it is possible to freely vary the metallic composition, and it is possible to easily obtain an adhesion film with a metallic composition regulated precisely, which has hitherto been difficult to obtain in the case of using an alloy target. Further, when the electric power applied to the individual targets is varied continuously or stepwise at the time of sputtering, it is possible to form an adhesion film whose metallic composition is varied continuously or stepwise in the thickness direction thereof, and, with the adhesion film differing in composition on the substrate side and on the rubber side, it is possible to obtain a rubber-based composite material in which each of a substrate and a rubber is provided with a particularly strong adhesive force.

According to the fourth invention, it is possible to efficiently produce a rubber-based composite material having a high adhesion performance between a substrate and a rubber.

DETAILED DESCRIPTION OF THE INVENTION

The present invention will be described more in detail below.

In the present invention, a rubber-based composite material is produced by forming an adhesion film on a substrate to be mated with a rubber for constituting the composite material, and laminating a rubber composition on the adhesion film, and vulcanizing the rubber composition.

In the present invention, the kind of the substrate serving as an object is not particularly limited, and the substrate may be a metal, a ceramic, a plastic or the like, of which a plastic substrate is particularly preferred. In this case, examples of the kind of the metallic substrate include steel, stainless steel, titanium alloys, aluminum, aluminum alloys, copper, copper alloys, zinc, zinc alloys, and amorphous alloys. In addition, various ceramic substrates and plastic substrates can be selected according to the purpose of the composite material. Examples of the ceramic substrate include quartz glass, whereas examples of the plastic substrate include hydrocarbon plastics such as polyethylene, polypropylene, polystylene, etc., polyester plastics such as polyethylene terephthalate, etc., polyamide plastics, and polycarbonate plastics. Incidentally, the shape and size of these substrates are not particularly limited but are appropriately selected according to the purpose of the composite material. Applicable examples of the shape of the substrate include a plate shape, a sheet shape, a film shape, a granular shape, and a fibrous shape.

Next, the above-mentioned first to third inventions will be described in detail below, on the basis of each invention.

First Invention

In the process for producing a rubber-based composite material according to the first invention, an adhesion film is formed by sputtering which is conducted by using a first target and a second target, composed of different metallic components and provided in a chamber, while moving a substrate from the first target side toward the second target side in sputtering atmospheres formed by applying electric power simultaneously to the first and second targets. This makes it possible to form an adhesion film having a gradient of metallic composition in the thickness direction thereof.

Figure 1:
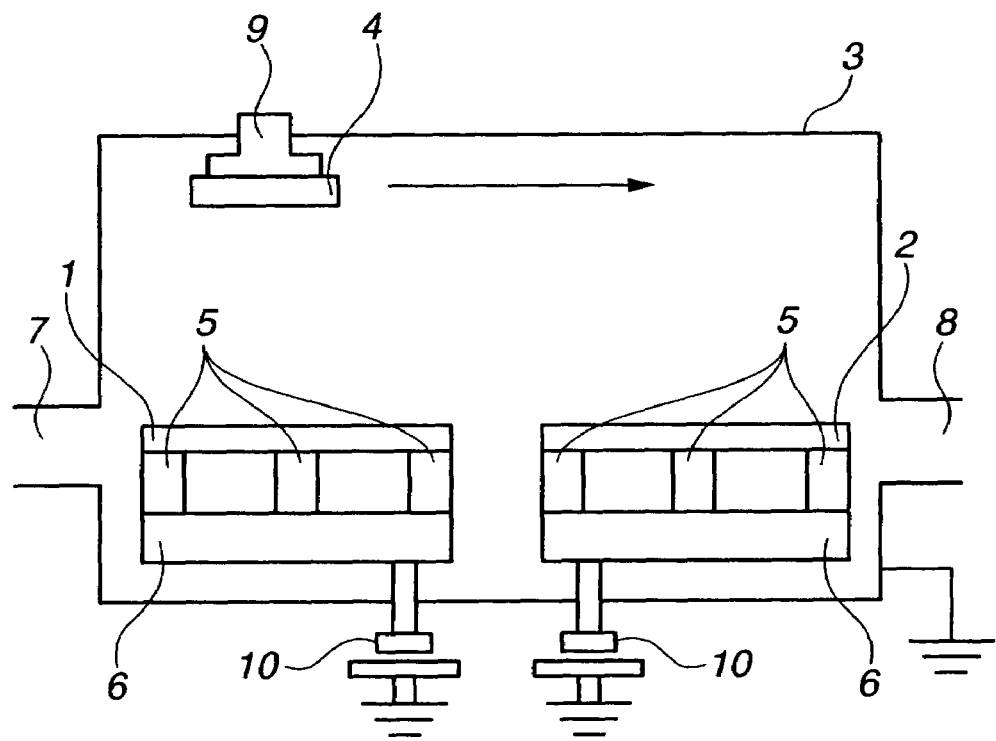
FIG. 1 is a schematic plan view of a sputtering apparatus for forming an adhesion film by sputtering in one embodiment of a process for producing a rubber-based composite material according to the first invention.

This process may be carried out, for example, in the manner in which, as shown in FIG. 1, a first target 1 and a second target 2 composed of different metallic components are arranged in a chamber 3 with their sputtering surfaces located on the same plane, and sputtering is conducted by moving a substrate 4 on which to form an adhesion film from the vicinity of the first target 1 toward the vicinity of the second target 2, with its surface for formation of the adhesion film being parallel to and opposed to the sputtering surfaces of the first and second target 1, 2, in sputtering atmospheres (formed principally in the spaces directed from the sputtering surfaces of the first and second targets 1, 2 toward the side of the substrate 4 ) formed by applying electric power simultaneously to the first and second targets 1, 2. Incidentally, in FIG. 1, symbol 5 denotes a magnet, 6 denotes a target electrode, 7 denotes a gas introduction port, 8 denotes a gas exhaust port (evacuation port), 9 denotes a substrate jig, and 10 denotes a power source.

To be more specific, the sputtering atmospheres formed by applying electric power to the first and second targets 1, 2 are formed in the directions from the sputtering surfaces of the first and second targets 1, 2 and in ranges somewhat broader than the individual sputtering surfaces. In this case, the metallic component constituting the first target 1 is principally sputtered in the sputtering atmosphere in the vicinity of the first target 1, whereas the metallic component constituting the second target 2 is principally sputtered in the sputtering atmosphere in the vicinity of the second target 2, and both of the metallic components are sputtered in the area where the two sputtering atmospheres overlap with each other. Therefore, when the substrate 4 is moved from the side of the first target 1 toward the side of the second target 2 in the sputtering atmospheres, an adhesion film is formed in which, as viewed in the thickness direction, the content of the metallic component constituting the first target decreases gradually from the side of the substrate 4 toward the rubber adhesion side, whereas the content of the metallic component constituting the second target 2 increases gradually from the side of the substrate 4 toward the rubber adhesion side, resulting in the formation of an adhesion film having a gradient of metallic composition in the thickness direction thereof.

With the adhesion film thus formed to have the gradient of metallic composition, it is possible to change the composition of the surface for contact with the adhesion film on the substrate side and on the rubber side. Particularly, when the adhesion film is formed with such a composition that a metallic component with good adhesiveness to the substrate predominates on the side of the substrate while a metallic component with good adhesiveness to the rubber predominates on the side for adhesion to the rubber, it is possible to simultaneously strengthen the adhesion between the adhesion film and the substrate and the adhesion between the adhesion film and the rubber, to ensure that the adhesion film itself has a higher strength due to the absence of any layer interface as compared with the case of laminating a plurality of adhesion films composed of different metals, and to form the adhesion film by a single step. Accordingly, it is possible to simplify the steps and to form an adhesion film having a high adhesion performance, without lowering productivity.

Incidentally, an example in which the first and second targets are disposed so that their sputtering surfaces are located on the same plane and in which the substrate is moved so that its surface for formation of the adhesion film is parallel to and opposed to the sputtering surfaces of the first and second targets has been shown in the embodiment shown in FIG. 1, the first invention is not limited to this example. Namely, the first and second targets may be so disposed that their sputtering surfaces are parallel to each other, or they may be disposed with such an inclination that their sputtering surfaces are inclined against the surface for formation of the adhesion film.

In addition, in the first invention, the sputtering gas is not particularly limited. When an only inert gas such as helium and argon is used, a metallic adhesion film composed of the metallic components constituting the first and second targets can be formed. Besides, where a reactive gas containing at least one element selected from the group consisting of oxygen, nitrogen, and carbon, such as oxygen gas, nitrogen gas, methane gas, etc. is used together with the inert gas, the sputtering is the so-called reactive sputtering, whereby it is possible to form a metallic compound adhesion film composed of a metallic oxide, a metallic nitride, or a metallic carbide of the metallic components constituting the first and second targets can be formed. In this case, it is preferable to use the reactive gas together with the inert gas such as helium and argon; particularly, it is preferable to form an adhesion film composed of a metallic oxide by using oxygen gas as the reactive gas and using argon as the inert gas.

Besides, in the formation of the adhesion film according to the first invention, the system for applying electric power to the targets is not particularly limited, and is selected according to the kind of the adhesion film to be formed; it is preferable to use a DC power source.

Second Invention

In the process for producing a rubber-based composite material according to the second invention, an adhesion film is formed by sputtering which is conducted by using a first target and a second target, composed of different metallic components and provided respectively in a first compartment and a second compartment of a chamber including the first and second compartments communicated with each other through a communication port, while moving a substrate from the side of the first target toward the side of the second target through the communication port in sputtering atmospheres formed by supplying reactive gases with different compositions respectively into the first and second compartments and applying electric power simultaneously to the first and second targets. This makes it possible to form an adhesion film having a gradient of composition of the components derived from the metallic components and the reactive gases in the thickness direction thereof.

Figure 2:
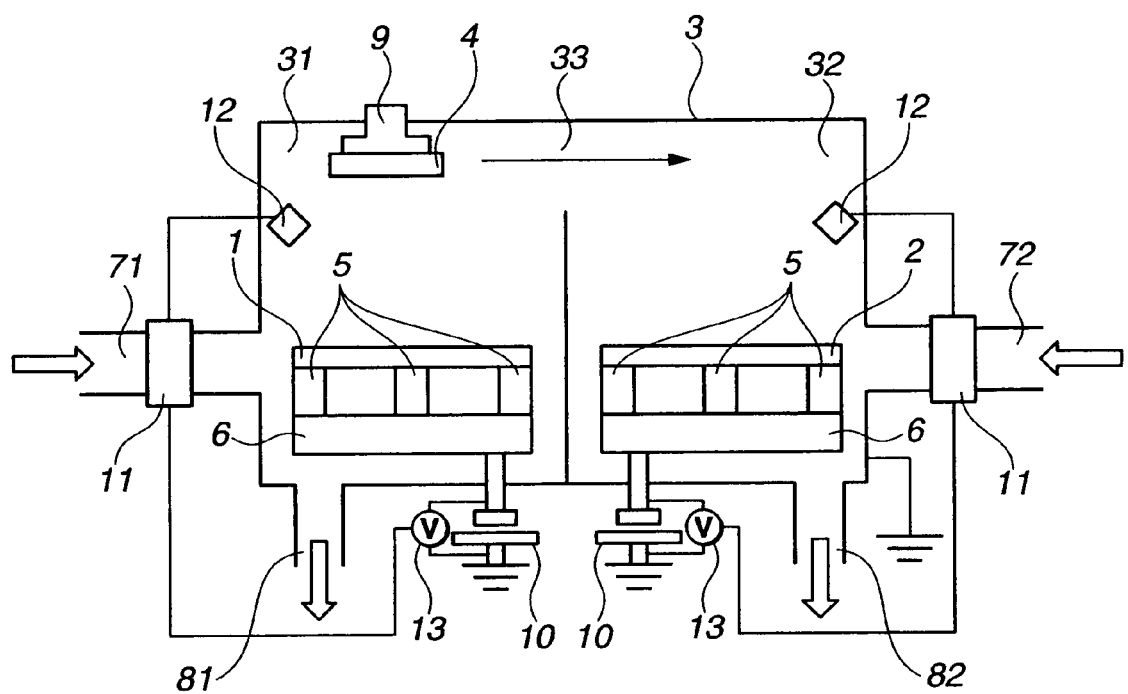
FIG. 2 is a schematic plan view of a sputtering apparatus for forming an adhesion film by sputtering in one embodiment of a process for producing a rubber-based composite material according to the second invention.

This process may be carried out, for example, in the manner in which, as shown in FIG. 2, a first target 1 and a second target 2 composed of different metallic components are disposed respectively in a first compartment 31 and a second compartment 32 of a chamber 3 including the first and second compartments 31, 32 communicated with each other through a communication port 33 so that their sputtering surfaces are located on the same plane, and sputtering is conducted by moving a substrate 4 on which to form an adhesion film from the vicinity of the first target 1 toward the vicinity of the second target 2 so that their surfaces for formation of the adhesion film are parallel to and opposed to the sputtering surfaces of the first and second targets 1, 2 in sputtering atmospheres (formed principally in the spaces directed from the sputtering surfaces of the first and second targets 1, 2 toward the side of the substrate 4) formed by supplying reactive gases with different compositions into the first and second compartments 31, 32 provided therein with the first and second targets 1, 2 through gas introduction ports 71, 72 respectively and applying electric power simultaneously to the first and second targets 1, 2. Incidentally, in FIG. 2, symbol 5 denotes a magnet, 6 denotes a target electrode, 81 and 82 denote gas exhaust ports (evacuation ports), 9 denotes a substrate jig, 10 denotes a power source, 11 denotes a gas flow rate controller, 12 denotes a plasma light emission detector, and 13 denotes a voltage mater.

To be more specific, the sputtering atmospheres formed by applying electric power to the first and second targets 1, 2 are formed in the directions from the sputtering surfaces of the first and second targets 1, 2 toward the side of the substrate 4 and in ranges somewhat broader than the individual sputtering surfaces. In this case, a metallic compound containing the metallic component constituting the first target 1 and a component derived from the reactive gas supplied into the first compartment 31 is principally sputtered in the sputtering atmosphere in the vicinity of the first target 1, whereas a metallic compound containing the metallic component constituting the second target 2 and a component derived from the reactive gas supplied into the second compartment 32 is principally sputtered in the sputtering atmosphere in the vicinity of the second target 2, and a metallic compound containing the metallic components constituting both the targets and components derived from the reactive gases is principally sputtered in the area where the two sputtering atmospheres overlap with each other. Therefore, when the substrate is moved from the side of the first target 1 toward the side of the second target 2 in these sputtering atmospheres, an adhesion film is formed with such a composition that, as viewed in the thickness direction, the contents of the components derived from the metallic compound constituting the first target 1 and the reactive gas supplied into the first compartment 31 decrease gradually from the side of the substrate toward the side for adhesion to a rubber, while the contents of the components derived from the metallic compound constituting the second target 2 and the reactive gas supplied into the second compartment 32 increase gradually from the side of the substrate toward the side for adhesion to the rubber, resulting in an adhesion film having a gradient of composition of the metallic components and the components derived from the reactive gases in the thickness direction thereof.

With the adhesion film thus formed to have the gradient of composition, it is possible to change the composition of the surface for contact with the adhesion film on the substrate side and on the rubber side. Particularly, when the adhesion film is formed with such a composition that a component with good adhesiveness to the substrate predominates on the side of the substrate while a component with good adhesiveness to the rubber predominates on the side for adhesion to the rubber, it is possible to simultaneously strengthen the adhesion between the adhesion film and the substrate and the adhesion between the adhesion film and the rubber, to ensure that the adhesion film itself has a higher strength due to the absence of any layer interface as compared with the case of laminating a plurality of adhesion films having different compositions, and to form the adhesion film by a single step. Accordingly, it is possible to simplify the steps and to form an adhesion film having a high adhesion performance, without lowering productivity.

Incidentally, an example in which the first and second targets are disposed so that their sputtering surfaces are located on the same plane and in which the substrate is moved so that its surface for formation of the adhesion film is parallel to and opposed to the sputtering surfaces of the first and second targets has been shown in the embodiment shown in FIG. 2, the second invention is not limited to this example. Namely, the first and second targets may be so disposed that their sputtering surfaces are parallel to each other, or they may be disposed with such an inclination that their sputtering surfaces are inclined against the surface for formation of the adhesion film.

In addition, in the process according to the second invention, as shown in FIG. 2, it is preferable that plasma light emission detectors 12, 12 are provided respectively in the first compartment 31 and the second compartment 32, and the sputtering is conducted while performing a plasma light emission monitor control for controlling the quantities of the reactive gases supplied into the first compartment 31 and the second compartment 32 by the gas flow rate controllers 11, 11 so as to keep constant the light emission quantities detected by the plasma light emission detectors and/or an impedance control for controlling the quantities of the reactive gases supplied into the first compartment 31 and the second compartment 32 by the gas flow rate controllers 11, 11 according to the voltages between the first target 1 or the second target 2 and earth (ground) measured by the voltage maters 13, 13, thereby performing such a precise control as to optimize the quantities of the reactive gases supplied into the first compartment 31 and the second compartment 32. With the sputtering conducted in this manner, the sputtering atmospheres are stabilized, and it is possible to obtain a uniform adhesion film which is stable in the gradient of composition, particularly the gradient of composition of the components derived from the reactive gases. As a system for carrying out the above-mentioned plasma light emission monitor control, there may be mentioned, for example, the Plasma Emission Control System produced by Ardenne, Germany. As a system for carrying out the above-mentioned impedance control, there may be mentioned, for example, the Impedance Control System produced by Ardenne, Germany.

On the other hand, in the process according to the second invention, it is also preferable that the first compartment 31 and the second compartment 32 are provided respectively with exhaust ports 81 and 82 as shown in FIG. 2, and the sputtering is conducted while exhausting the gases simultaneously through the exhaust ports 81, 82. This makes it possible to prevent the reactive gases supplied respectively into the first compartment 31 and the second compartment 32 from mixing with each other to an excessive extent through a communication port 33, and to stably produce the adhesion film having the gradient of composition.

In addition, in the second invention, it is preferable to use a gas containing at least one element selected from the group consisting of oxygen, nitrogen, and carbon, such as methane gas, as the reactive gas. In the second invention, the sputtering is the so-called reactive sputtering, whereby a metallic compound adhesion film composed of a metallic oxide, a metallic nitride, a metallic carbide or the like of the metallic components constituting the first and second targets is formed. In this case, it is preferable to use the reactive gas together with an inert gas such as helium and argon; particularly, it is preferable to form an adhesion film composed of a metallic compound containing oxygen and nitrogen, by using oxygen gas and nitrogen gas as the reactive gases and using argon as the inert gas. In this case, reactive gases with different compositions, preferably, reactive gases containing different components are used respectively for the first and second targets (respectively in the first and second compartments).

Besides, in the formation of the adhesion film according to the second invention, the system for applying electric power to the targets is not particularly limited but is selected according to the kind of the adhesion film to be formed; it is preferable to use a DC power source.

Third Invention

In the process for producing a rubber-based composite material according to the third invention, the adhesion film is formed by sputtering which is conducted by using a first target and a second target, composed of different metallic components and provided in a chamber, while moving a substrate from the first target side toward the second target side in magnetron sputtering atmospheres formed by supplying a reactive gas into the chamber and applying electric power to the first and second targets on the basis of a dual cathode system. This makes it possible to produce with good productivity an adhesion film which has a gradient of metallic composition in the thickness direction thereof and has few defects.

The sputtering in the third invention is magnetron sputtering of the dual cathode system. The dual cathode magnetron sputtering is classified into a bipolar-type dual cathode magnetron sputtering and a unipolar-type dual cathode magnetron sputtering. In the third invention, either of the bipolar type and the unipolar type may be applied; particularly, it is preferable to use the bipolar-type dual cathode magnetron sputtering. The bipolar-type dual cathode system resides in that two sets of a sputtering target and an AC power source for supplying electric power to the target are connected to each other through a switching unit, and the two targets are alternately supplied with electric power with polarity switched over by the switching unit.

Figure 3:
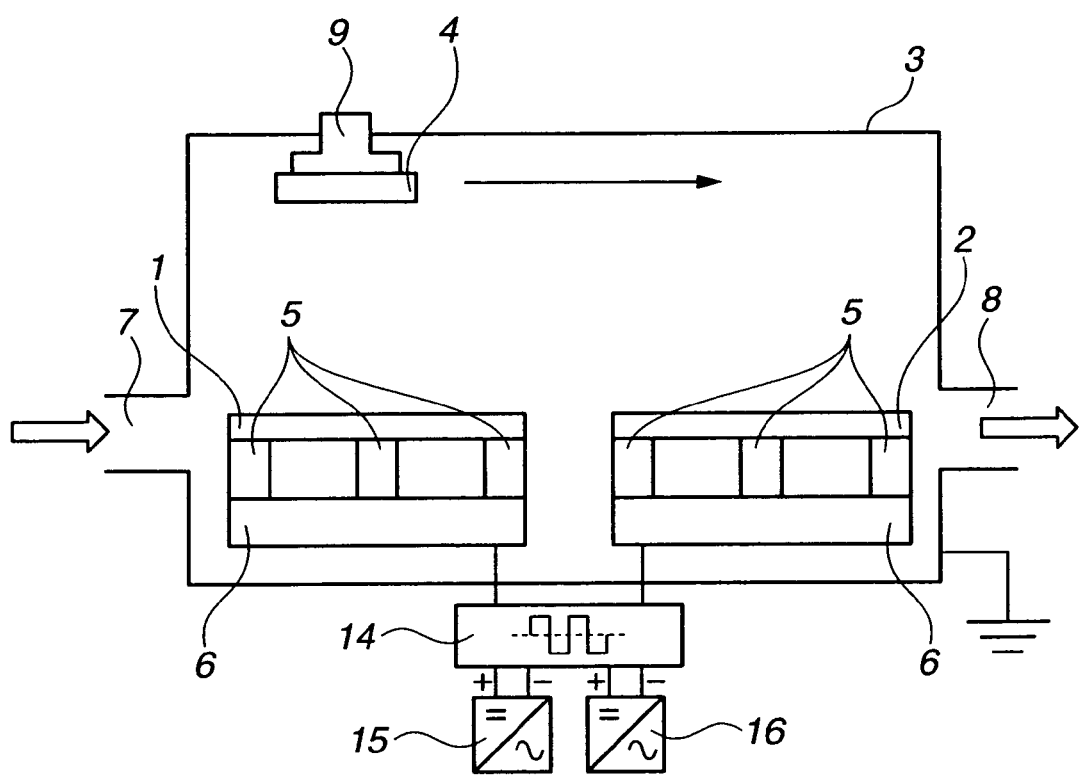
FIG. 3 is a schematic plan view of a sputtering apparatus for forming an adhesion film by sputtering in one embodiment of a process for producing a rubber-based composite material according to the third invention.

This process may be carried out, for example, in the manner in which, as shown in FIG. 3, a first target 1 and a second target 2 containing different metallic components are disposed in a chamber 3 so that their sputtering surfaces are located on the same plane, and sputtering is conducted while moving a substrate 4 on which to form an adhesion film from the vicinity of the first target 1 toward the vicinity of the second target 2 so that its surface for formation of the adhesion film is parallel to and opposed to the sputtering surfaces of the first and second targets 1, 2, in magnetron sputtering atmospheres (formed principally in the spaces directed from the sputtering surfaces of the first and second targets 1, 2 toward the side of the substrate 4) formed by applying electric power to the first and second targets 1, 2 from a dual cathode control unit (power source) 10 on the basis of the dual cathode system. Incidentally, in FIG. 3, symbol 5 denotes a magnet, 6 denotes a target electrode, 7 denotes a gas introduction port, 8 denotes a gas exhaust port (evacuation port), 9 denotes a substrate jig, 14 denotes a switching unit, and 15, 16 denote AC power sources.

To be more specific, the sputtering atmospheres formed by applying electric power to the first and second targets 1, 2 are formed in the directions from the sputtering surfaces of the first and second targets 1, 2 and in ranges somewhat broader than the individual sputtering surfaces. In this case, the metallic component constituting the first target is principally sputtered in the sputtering atmosphere in the vicinity of the first target, while the metallic component constituting the second target 2 is principally sputtered in the sputtering atmosphere in the vicinity of the second target, and both the metallic components are sputtered in the area where the two sputtering atmospheres overlap with each other. Therefore, when the substrate 4 is moved from the side of the first target 1 toward the side of the second target 2 in the sputtering atmospheres as above-mentioned, an adhesion film is formed in which, as viewed in the thickness direction, the content of the metallic component constituting the first target 1 decreases gradually from the side of the substrate 4 toward the side for adhesion to a rubber, while the content of the metallic component constituting the second target 2 increases gradually from the side of the substrate 4 toward the side for adhesion to the rubber, resulting in the formation of an adhesion film having a gradient of metallic composition in the thickness direction thereof.

In addition, the first and second target 1, 2 are supplied with electric power from the AC power sources 15, 16. The electric power is supplied alternately to the side of the first target 1 (the side of the AC power source 15) and the side of the second target 2 (the side of the AC power source 16) through the switching unit 14. Therefore, it is possible to form the adhesion film stably and speedily. Besides, since the polarity is changed by the changeover effected through the switching unit, accumulation of electric charges in the targets is precluded, so that it is possible to stably perform the sputtering without damaging the substrate or the targets, and to obtain an adhesion film with a uniform gradient of composition.

With the adhesion film thus formed to have the gradient of composition, it is possible to change the composition of the surface for contact with the adhesion film on the substrate side and on the rubber side. Particularly, when the adhesion film is formed with such a composition that a component with good adhesiveness to the substrate predominates on the side of the substrate while a component with good adhesiveness to the rubber predominates on the side for adhesion to the rubber, it is possible to simultaneously strengthen the adhesion between the adhesion film and the substrate and the adhesion between the adhesion film and the rubber, to ensure that the adhesion film itself has a higher strength due to the absence of any layer interface as compared with the case of laminating a plurality of adhesion films having different compositions, and to form the adhesion film by a single step. Accordingly, it is possible to simplify the steps and to form an adhesion film having a high adhesion performance, without lowering productivity.

Incidentally, an example in which the first and second targets are disposed so that their sputtering surfaces are located on the same plane and in which the substrate is moved so that its surface for formation of the adhesion film is parallel to and opposed to the sputtering surfaces of the first and second targets has been shown in the embodiment shown in FIG. 3, the third invention is not limited to this example. Namely, the first and second targets may be so disposed that their sputtering surfaces are parallel to each other, or they may be disposed with such an inclination that their sputtering surfaces are inclined against the surface for formation of the adhesion film.

Besides, in the third invention, it is preferable to use a gas containing at least one element selected from the group consisting of oxygen, nitrogen, and carbon, such as methane gas, as the reactive gas. In the third invention, the sputtering is the so-called reactive sputtering, whereby a metallic compound adhesion film composed of a metallic oxide, a metallic nitride, a metallic carbide or the like of the metallic components constituting the first and second targets is formed. In this case, it is preferable to use the reactive gas together with an inert gas such as helium and argon. Particularly, it is preferable to form an adhesion film composed of a metallic oxide by using oxygen gas as the reactive gas and using argon as the inert gas.

In addition, in the formation of the adhesion film according to the third invention, a magnetron system is used as the system for applying electric power to the targets. Since the adhesion film is formed by the magnetron system, the adhesion film can be formed with less defects and with good productivity, even in the case of forming an adhesion film composed of a metallic oxide through reactive sputtering, particularly even in the case of forming an adhesion film composed of a metallic oxide through reactive sputtering in which oxygen is used.

Features Common to the First to Third Inventions

In the formation of an adhesion film according to the first to third inventions, the target is preferably aluminum, chromium, titanium, zinc, silicon, cobalt, nickel, copper, silver, tantalum, or tungsten, or an alloy of these elements. Incidentally, different metallic components are used respectively for the first and second targets.

In addition, the thickness of the adhesion film is appropriately selected, and is preferably in the range of 1 nm to 100 μm, particularly 5 nm to 1 μm.

On the other hand, as the rubber component in the rubber composition laminated on the substrate and vulcanized, rubber components selected from natural rubber (NR) and synthetic rubbers having a carbon-carbon double bond in the structural formula thereof can be used either singly or as a blend of two or more thereof. The synthetic rubbers include homopolymers of a conjugated diene compound such as isoprene, butadiene, chloroprene, etc. such as polyisoprene rubber (IR), polybutadiene rubber (BR), polychloroprene rubber, etc.; copolymers of the conjugated diene compound with styrene, acrylonitrile, vinylpyridine, acrylic acid, methacrylic acid, alkyl acrylates, alkyl methacrylates or the like such as styrene-butadiene copolymer rubber (SBR), vinylpyridine-butadiene-styrene copolymer rubber, acrylonitrile-butadiene copolymer rubber, acrylic acid-butadiene rubber, methacrylic acid-butadiene copolymer rubber, methyl acrylate-butadiene rubber, methyl methacrylate-butadiene rubber, etc.; copolymers of olefins such as ethylene, propylene, isobutylene, etc. with a diene compound [for example, isobutylene-isoprene copolymer rubber (IIR)]; copolymers of olefins with a non-conjugated diene (EPDM) [for example, ethylene-propylene-cyclopentadiene ternary copolymer, ethylene-propylene-5-ethylidene-2-norbornane ternary copolymer, ethylene-propylene-1,4-hexadiene ternary copolymer]; polyalkenamers obtained by ring-opening polymerization of a cycloolefin [for example, polypentenamer]; rubbers obtained by ring-opening polymerization of oxysilane ring [for example, polyepichlorohydrin rubber capable of sulfur vulcanization]; polypropylene oxide rubber, etc. In addition, the synthetic rubbers include halides of the above-mentioned various rubbers, for example, chlorinated isobutylene-isoprene copolymer rubber (Cl-IIR), brominated isobutylene-isoprene copolymer rubber (Br-IIR), etc. Further, ring-opened polymers of norbornane can also be used. Furthermore, blends of the above-mentioned rubbers with a saturated elastomer such as epichlorohydrin rubber, polypropylene oxide rubber, chlorosulfonated polyethylene, etc. can also be used.

Besides, it is preferable to blend a cross-linking agent such as sulfur, organic sulfur compounds, etc. into the above-mentioned rubber composition in an amount of 0.01 to 10 parts by weight, particularly 0.1 to 6 parts by weight, per 100 parts by weight of the above-mentioned rubber component. In addition, it is preferable to blend a vulcanization accelerator in an amount of 0.01 to 10 parts by eight, particularly 0.1 to 5 parts by weight, per 100 parts by weight of the rubber component.

Furthermore, the above-mentioned rubber composition may be admixed with an oil, for example, mineral oils such as paraffinic oils, naphthenic oils, aromatic process oils, ethylene-α-olefin co-oligomers, paraffin wax, liquid paraffin, etc., and vegetable oils such as caster oil, cotton seed oil, linseed oil, rape seed oil, soybean oil, palm oil, coconut oil, peanut oil, etc. The amount of the oil or oils is preferably 3 to 50 parts by weight, particularly 4 to 10 parts by weight, per 100 parts by weight of the rubber component.

The rubber compositions may be prepared by further adding thereto a filler such as carbon black, silica, calcium carbonate, calcium sulfate, clay, mica, etc., a vulcanization accelerating assistant such as zinc white, stearic acid, etc. and the like by the normal method, according to the purpose or use of the rubber compositions.

In the first to third inventions, the rubber-based composite material is produced by thermally press bonding the above-mentioned rubber composition onto the substrate provided thereon with the adhesion film, and effecting adhesion through vulcanization. In this case, the vulcanization may be conducted by sulfur vulcanization or by organic sulfur vulcanization using an organic sulfur compound such as dithiomorpholine, thiuram vulcanization, etc., according to a normal method. Among these methods, particularly preferred is the sulfur vulcanization method. In this case, the amount of sulfur or the organic sulfur compound, in terms of the amount of sulfur, is preferably 0.5 to 7 parts by weight, particularly 1 to 6 parts by weight, per 100 parts by weight of the rubber component. The vulcanization conditions are appropriately selected, and are not particularly limited; for example, the vulcanization may be conducted at 145° C. for about 30 min.

Besides, in the processes according to the first to third inventions, firm joining can be achieved between the substrate and the rubber, even in the case where the rubber composition contains sulfur in a large amount, for example, 5 to 6 parts by weight, per 100 parts by weight of the rubber component and the vulcanization joining is conducted for a long time. Therefore, the processes according to the first to third inventions can be widely used for the production of rubber-based composite materials using fibrous metal as a core member, such as tires, power transmission belts, conveyor belts, hoses, etc. which require good joint strength between a substrate and a rubber, and for the production of various rubber products and parts such as rubber vibration insulator, vibration damper, rubber crawler, rubber screen, rubber roll, etc.

Next, the fourth invention will be described in detail.

Fourth Invention

In the process for producing a rubber-based composite material according to the fourth invention, the adhesion film is formed by sputtering which is conducted by using a plurality of targets, composed of metals or metallic compounds containing different metallic elements and provided in a chamber, while rotating the substrate in sputtering atmospheres formed by applying electric power simultaneously to the targets. Particularly, it is preferable that the sputtering surfaces of the targets are inclined toward the surface for formation of the adhesion film of the substrate.

Figure 4:
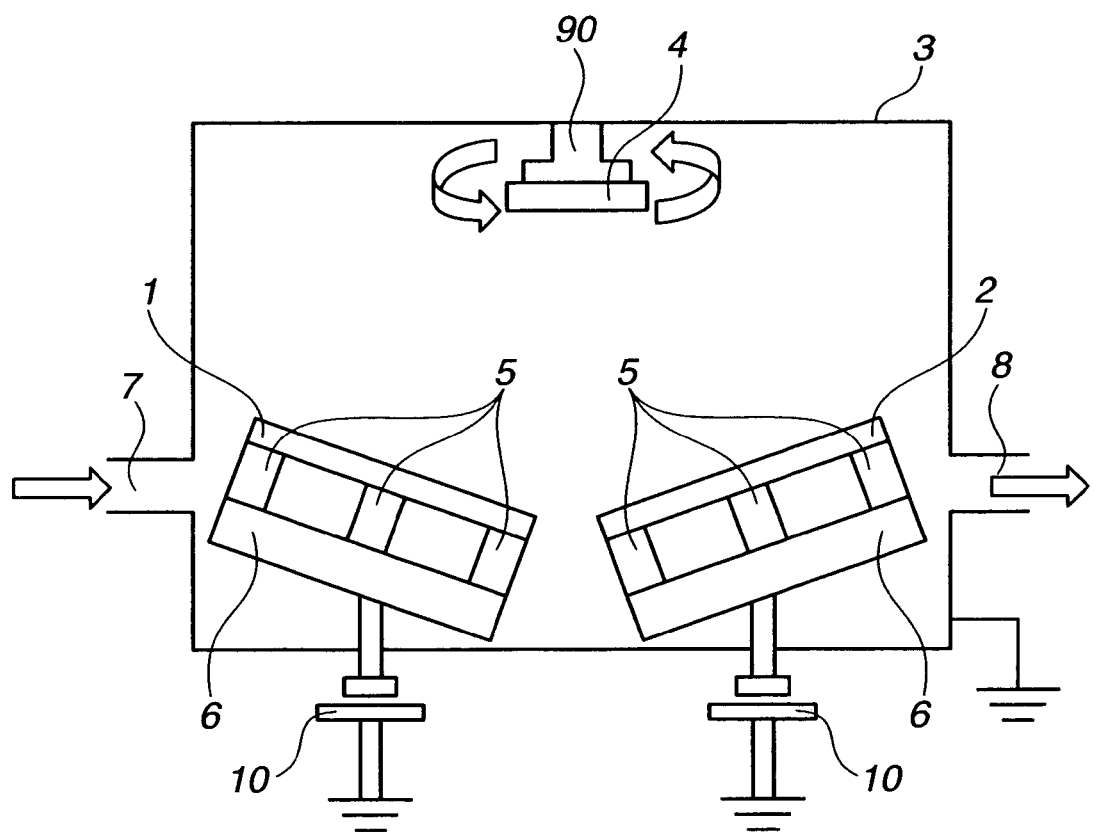
FIG. 4 is a schematic plan view of a sputtering apparatus for forming an adhesion film by sputtering in one embodiment of a process for producing a rubber-based composite material according to the fourth invention.

This process may be carried out, for example, in the manner in which, as shown in FIG. 4, two targets 1, 2 composed of different metallic components are disposed in a chamber 3, and sputtering is conducted while rotating the substrate 4 on which to form the adhesion film so that its surface for formation of the adhesion film is directed toward the sputtering surfaces of the targets 1, 2 in sputtering atmospheres (formed principally in the spaces directed from the sputtering surfaces of the first and second targets 1, 2 toward the side of the substrate 4) generated by applying electric power simultaneously to the targets 1, 2. Incidentally, in FIG. 4, symbol 5 denotes a magnet, 6 denotes a target electrode, 7 denotes a gas introduction port, 8 denotes a gas exhaust port (evacuation port), 90 denotes a turntable, and 10 denotes a power source.

When the adhesion film is formed by this process, the adhesion film contains the plurality of metallic elements, and, since the substrate is rotated, the metallic composition in the plane directions of the adhesion film can be made uniform. In this case, further, by varying the electric power applied to each of the targets, it is possible to freely vary the metallic composition, and to easily obtain an adhesion film with a precisely regulated metallic composition, which has hitherto been difficult to obtain by use of an alloy target.

Furthermore, when the electric power supplied to each of the targets is varied continuously or stepwise at the time of sputtering, it is possible to form an adhesion film with a metallic composition varied continuously or stepwise in the thickness direction thereof.

This process will be described specifically, taking as an example the case of using two targets as shown in FIG. 4. In this case, for example, electric power gradually decreased so as to be maximum at the start of sputtering and to be substantially zero at the end of the sputtering is supplied to one target 1, while electric power gradually increased so as to be substantially zero at the start of the sputtering and to be maximum at the end of the sputtering is supplied to the other target 2. as a result, an adhesion film is formed in which, as viewed in the thickness direction, the content of the metallic component constituting the target 1 decreases gradually from the side of the substrate 4 toward the side for adhesion to a rubber, whereas the content of the metallic component constituting the target 2 increases gradually from the side of the substrate 4 toward the side for adhesion to the rubber; thus, the adhesion film obtained has a gradient of metallic composition in the thickness direction thereof.

With the adhesion film thus formed to have the gradient of composition, it is possible to change the composition of the surface for contact with the adhesion film on the substrate side and on the rubber side. Particularly, when the adhesion film is formed with such a composition that a metallic component with good adhesiveness to the substrate predominates on the side of the substrate while a metallic component with good adhesiveness to the rubber predominates on the side for adhesion to the rubber, it is possible to simultaneously strengthen the adhesion between the adhesion film and the substrate and the adhesion between the adhesion film and the rubber.

In the formation of the adhesion film as above-mentioned, the targets are composed of metals or metallic compounds containing different metallic elements. The targets are each preferably a metal, for example, aluminum, chromium, titanium, zinc, silicon, cobalt, nickel, copper, silver, tantalum, or tungsten or an alloy of these elements. Incidentally, the targets are composed of different metallic components.

In addition, in the fourth invention, the sputtering gas is not particularly limited. When an only inert gas such as helium and argon is used as the sputtering gas, it is possible to form a metallic (alloy) adhesion film composed only of the metallic component or components. When a reactive gas containing at least one element selected from the group consisting of oxygen, nitrogen, and carbon, such as oxygen gas, nitrogen gas, methane gas, etc. is used together with the inert gas, the sputtering is the so-called reactive sputtering, whereby it is possible to form a metallic compound adhesion film composed of a metallic oxide, a metallic nitride, or a metallic carbide of the metallic components constituting the targets. In this case, it is possible to use the reactive gas together with the inert gas such as helium and argon.

Besides, in the formation of the adhesion film according to the fourth invention, the system for applying electric power to the targets is not particularly limited, and is selected according to the kind of the adhesion film to be formed; it is preferable to use a DC power source.

Incidentally, the thickness of the adhesion film is appropriately selected, and is preferably in the range of 1 nm to 100 μm, particularly 5 nm to 1 μm.

On the other hand, examples of the rubber component in the rubber composition laminated on the substrate and vulcanized include the same rubber components as mentioned in the descriptions of the first to third inventions above.

The rubber-based composite material according to the fourth invention is produced by thermally press bonding the above-mentioned rubber composition on the substrate provided thereon with the adhesion film, and effecting adhesion through vulcanization. The vulcanization may be conducted by sulfur vulcanization or by organic sulfur vulcanization using an organic sulfur compound such as dithiomorpholine, tiuram vulcanization, etc., according to a normal method. Among these methods, particularly preferred is the sulfur vulcanization method. In this case, the amount of sulfur or the organic sulfur compound, in terms of the amount of sulfur, is preferably 0.5 to 7 parts by weight, particularly 1 to 6 parts by weight, per 100 parts by weight of the rubber component.

Besides, the rubber composition may be prepared by adding thereto a filler such as carbon black, silica, calcium carbonate, calcium sulfate, clay, mica, etc., a vulcanization accelerator, a vulcanization accelerating assistant such as a vulcanization accelerator, zinc white, steric acid, etc. and the like by the normal method, according to the purpose or use of the composite material.

Furthermore, the above-mentioned rubber composition may be admixed with an oil such as mineral oils such as paraffinic oils, naphthenic oils, aromatic process oils, ethylene-a-olefin co-oligomers, paraffin wax, liquid paraffin, etc., and vegetable oils such as caster oil, cotton seed oil, linseed oil, rape seed oil, soybeen oil, palm oil, coconut oil, peanut oil, etc. The amount of the oil or oils is preferably 3 to 50 parts by weight, particularly 4 to 10 parts by weight, per 100 parts by weight of the rubber component.

Incidentally, the vulcanization conditions are appropriately selected, and differs depending, for example, on the kind and blending of the rubber composition. For example, a vulcanization temperature of 140 to 160° C., particularly 140 to 150° C., and a vulcanization time of 5 to 120 min, particularly 10 to 60 min, are preferable, since a high adhesion performance can be obtained when the vulcanization is conducted under these conditions.

Besides, the process according to the fourth invention can be widely used for the production of rubber-based composite materials using fibrous metal as a core member, such as tires, power transmission belts, conveyor belts, hoses, etc. which require good joint strength between a substrate and a rubber, and for the production of various rubber products and parts such as rubber vibration insulator, vibration damper, rubber crawler, rubber screen, rubber roll, etc.

EXAMPLE

The present invention will be described in detail below, referring to Examples and Comparative Examples, the invention being not limited to the following Examples.

Example 1, Comparative Example 1 (An Example and a Comparative Example, Pertaining to the First Invention)

Example 1

Figure 5:
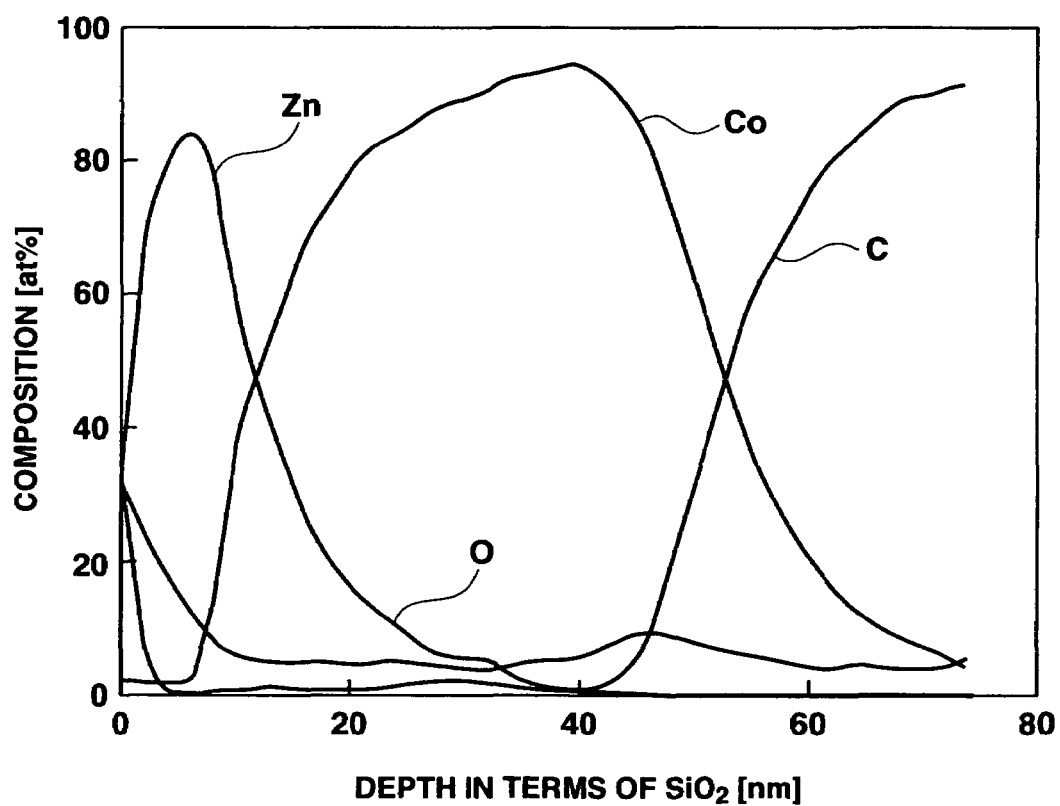
FIG. 5 is a diagram showing the composition distribution in the thickness direction of an adhesion film obtained in Example 1.

A sputtering apparatus as shown in FIG. 1 was used, Co was used as the first target, whereas Zn was used as the second target, Ar in a flow rate of 40 cc/min and $O_2$ in a flow rate of 10 cc/min were used as the sputtering gas, and electric power (first target: 2.0 kW; second target: 1.0 kW) was simultaneously supplied to the first and second targets from DC power sources, to form sputtering atmospheres pertaining to the first and second targets at a pressure of 0.7 Pa. In the sputtering atmospheres, sputtering was conducted while moving a PET film at a velocity of 0.5 m/min from the first target side toward the second target side, with its surface for formation of an adhesion film being parallel to the sputtering surfaces of the targets and spaced from the sputtering surfaces by 110 mm, to form the adhesion film on the PET film. The composition distribution in the thickness direction of the adhesion film was measured by use of an XPS (Quantum 2000, a product by ULVAC PHI K.K.), the results being shown in FIG. 5.

Next, a rubber composition having a composition shown in Table 1 was laminated on the PET film provided thereon with the adhesion film, and was vulcanized (145° C.×30 min) and press bonded, to obtain a rubber-PET composite material.

TABLE 1

| | Amount (parts by weight) |
|---|---|
| Natural rubber | 100 |
| Carbon black | 60 |
| Stearic acid | 2 |
| Zinc white | 5 |
| Age resistor | 2 |
| Vulcanization accelerator | 1 |
| Sulfur | 2 |

Age resistor: Noclak 6C, produced by Ouchishinko Chemical Industrial Co., Ltd.
Vulcanization preventor: Nocselar NS-P, produced by Ouchishinko Chemical Industrial Co., Ltd.

In addition, the adhesion performance of the adhesion film obtained as above was evaluated by the following method, the results being shown in Table 2 below.

Initial adhesion performance: After the formation of the adhesion film, the rubber was immediately vulcanized to effect adhesion, and the product was served to evaluation.

Storage stability: After the formation of the adhesion film, the adhesion film was held at a temperature of 40° C. and a humidity of 95% for 3 days, then the rubber was vulcanized to effect adhesion, and the product was served to evaluation.

Durability of adhesion: After the formation of the adhesion film, the rubber was vulcanized to effect adhesion, then the product was held at a temperature of 40° C. and a humidity of 95%, before being served to evaluation.

Comparative Example 1

A rubber-PET composite material was obtained by forming an adhesion film on a PET film (sputtering time: 60 sec) in the same manner as in Example 1, except that electric power was not applied to the second target and the sputtering was conducted with the PET film stopped in the vicinity of the first target. The adhesion performance of the adhesion film thus obtained was evaluated by the same method as in Example 1, the results being shown in Table 2.

TABLE 2

| | Example 1 | Comparative Example 1 |
|---|---|---|
| Initial adhesion performance | 10 | 9 |
| Storage stability | 8 | 4 |
| Durability of adhesion | 8 | 8 |

Example 2, Comparative Example 2 (An Example and a Comparative Example, Pertaining to the Second Invention)

Example 2

Figure 6:
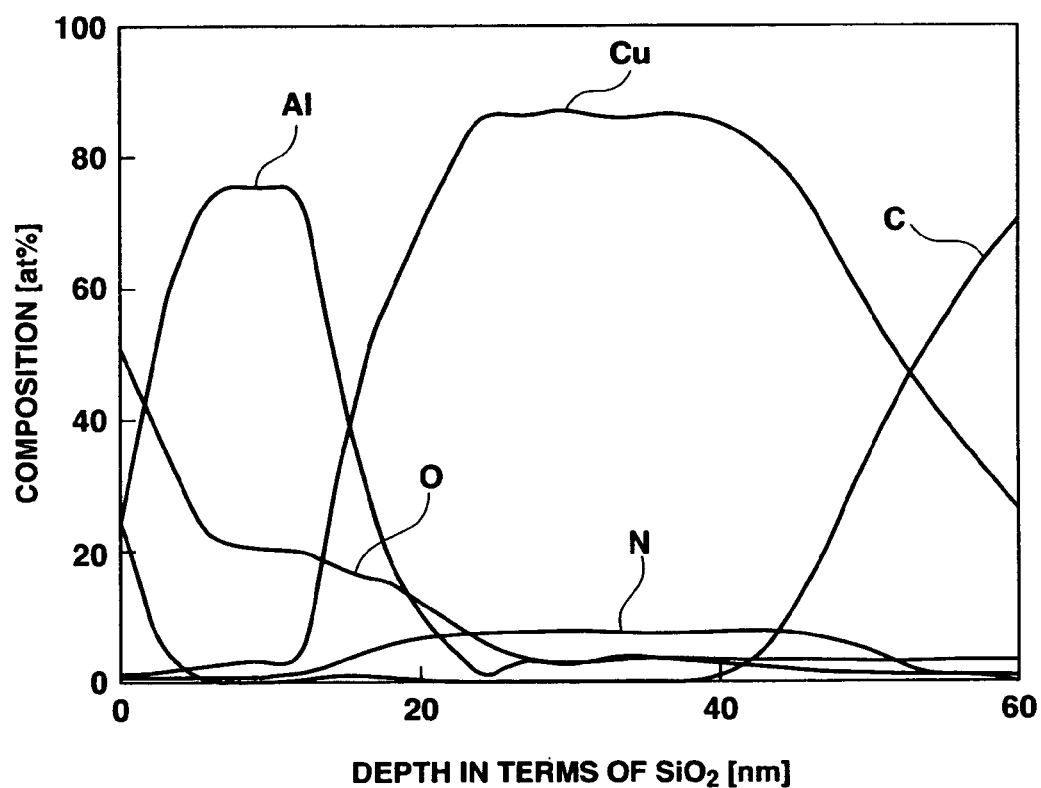
FIG. 6 is a diagram showing the composition distribution in the thickness direction of an adhesion film obtained in Example 2.

A sputtering apparatus as shown in FIG. 2 was used, Cu was used as the first target, whereas Al was used as the second target, Ar in a flow rate of 100 cc/min and $N_2$ in a flow rate of about 15 cc/min (average) controlled by a plasma light emission monitor control for controlling the flow rate by detecting the plasma light emission so as to keep the flow rate constant were introduced to the first target side (first compartment) as the sputtering gas, whereas Ar in flow rate of 100 cc/min and $O_2$ in a flow rate of about 45 cc/min (average) controlled by a plasma light emission monitor control for controlling the flow rate by detecting the plasma light emission so as to keep the flow rate constant were introduced to the second target side (second compartment) as the sputtering gas, and, in this condition, electric power (first target: 2.0 kW; second target: 1.0 kW) was supplied simultaneously to the targets by DC power sources, and the gases are simultaneously exhausted through exhaust ports provided in the first and second compartments to keep the pressure at 0.7 Pa, thereby forming sputtering atmospheres pertaining to the first and second targets. In the sputtering atmospheres, sputtering was conducted while moving a PET film at a velocity of 0.5 m/min from the first target side toward the second target side through the communication port, with its surface for formation of an adhesion film being parallel to the sputtering surfaces of the targets and spaced from the sputtering surfaces by 110 mm, to form the adhesion film on the PET film. The composition distribution in the thickness direction of the adhesion film thus obtained was measured by use of an XPS (Quantum 2000, a product by ULVAC PHI K.K.), the results being shown in FIG. 6.

Next, a rubber composition having a composition shown in Table 1 (the same as in Example 1) was laminated on the PET film provided thereon with the adhesion film, and was vulcanized (145° C.×30 min) and press bonded, to obtain a rubber-PET composite material.

The adhesion performance of the adhesion film obtained above was evaluated in the same method as in Example 1, the results being shown in Table 3.

Comparative Example 2

A rubber-PET composite material was obtained by forming an adhesion film on a PET film (sputtering time: 60 sec) in the same manner as in Example 2, except that electric power was not applied to the second target, the PET film was kept stopped in the vicinity of the first target, and Ar in a flow rate of 100 cc/min and $N_2$ in a flow rate of 15 cc/min were introduced as the sputtering gas without performing the plasma light emission control. The adhesion performance of the adhesion film thus obtained was evaluated by the same method as in Example 1, the results being shown in Table 3.

TABLE 3

| | Example 2 | Comparative Example 2 |
|---|---|---|
| Initial adhesion performance | 9 | 10 |
| Storage stability | 8 | 3 |
| Durability of adhesion | 7 | 7 |

Example 3, Comparative Example 3 (An Example and a Comparative Example, Pertaining to the Third Invention)

Example 3

Figure 7:
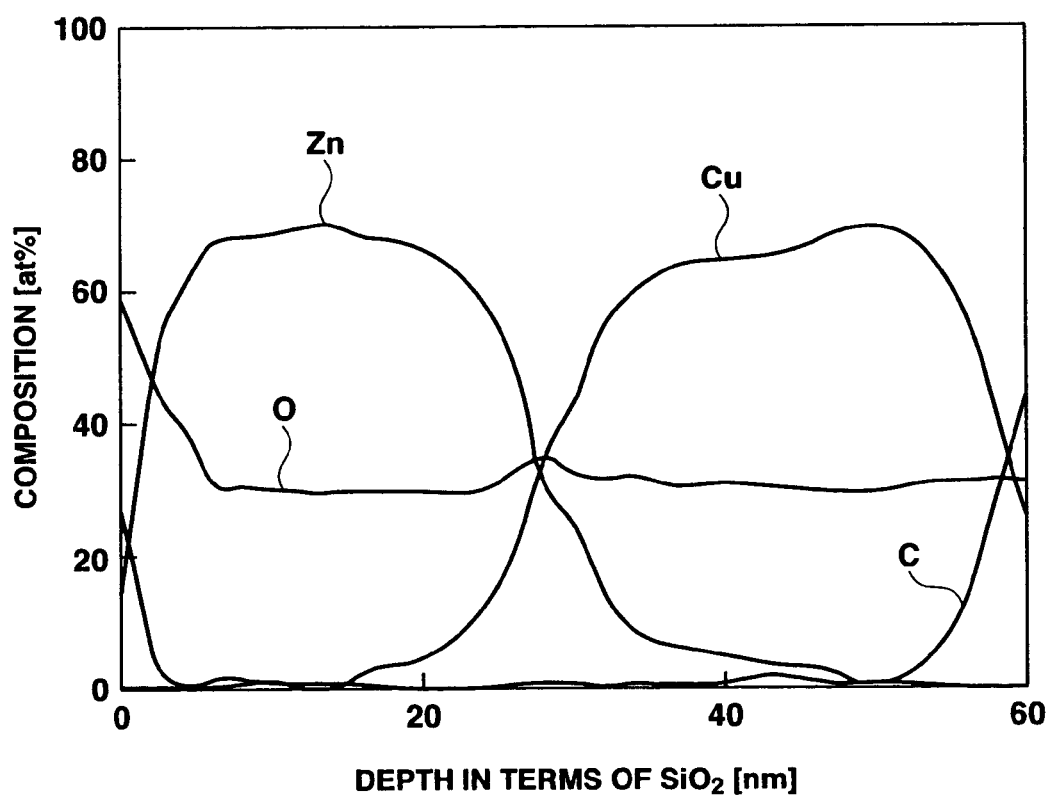
FIG. 7 is a diagram showing the composition distribution in the thickness direction of an adhesion film obtained in Example 3.

A sputtering apparatus as shown in FIG. 3 was used, Cu was used as the first target, whereas Zn was used as the second target, Ar in a flow rate of 200 cc/min and $O_2$ in a flow rate of 50 cc/min were introduced as the sputtering gas, and electric power (2.0 kW) was applied to the targets by use of a switching unit, to form sputtering atmospheres pertaining to the first and second targets at a pressure of 0.7 Pa. In the sputtering atmospheres, sputtering (dual cathode magnetron sputtering) was conducted while moving a PET film at a velocity of 0.5 m/min from the first target side toward the second target side, with its surface for formation of an adhesion film being parallel to the sputtering surfaces of the targets and spaced from the sputtering surfaces by 110 mm, to form the adhesion film on the PET film. The composition distribution in the thickness direction of the adhesion film thus obtained was measured by an XPS (Quantum 2000, a product by ULVAC PHI K.K.), the results being shown in FIG. 7.

Next, a rubber composition having a composition shown in Table 1 (the same as in Example 1) was laminated on the PET film provided thereon with the adhesion film, and was vulcanized (145° C.×30 min) and press bonded, to obtain a rubber-PET composite material.

The adhesion performance of the adhesion film was evaluated by the same method as in Example 1, the results being shown in Table 4.

Comparative Example 3

A rubber-PET composite material was obtained by forming an adhesion film on a PET film (sputtering time: 90 sec) in the same manner as in Example 3, except that Cu was used as the first target and as the second target, and electric power was supplied from DC sources without using the switching unit. The adhesion performance of the adhesion film obtained was evaluated by the same method as in Example 1, the results being shown in Table 4.

TABLE 4

|  | Example 3 | Comparative Example 3 |
| --- | --- | --- |
| Initial adhesion performance | 10 | 8 |
| Storage stability | 8 | 2 |
| Durability of adhesion | 8 | 7 |

Examples 4–6 (Examples Pertaining to the Fourth Invention)

A sputtering apparatus as shown in FIG. 4 was used, Cu and Zn were used as targets (3 inφ: circular), Ar in a flow rate of 50 cc/min was introduced as the sputtering gas, and electric power (Cu target: 300 W; Zn target: 25 W) was supplied to the targets by DC power sources, to form sputtering atmospheres pertaining to the Cu and Zn targets at a pressure of 0.7 Pa. In the sputtering atmospheres, sputtering (discharge time: 3 min) was conducted while rotating the PET (rotational speed: 20 rpm) by use of a turntable, to form an adhesion film on the PET film. The adhesion film had a composition of Cu:Zn=7:3 (atomic ratio).

Next, a rubber composition having a composition shown in Table 1 (the same as in Example 1) was laminated on the PET film provided thereon with the adhesion film, and was vulcanized (temperature: 145° C.; time: 10 min (Example 4), 30 min (Example 5), 60 min (Example 6)) and press bonded, to obtain rubber-PET composite materials.

The adhesion performances of the rubber-PET composite materials were evaluated by a peel test pertaining to the rubber-PET adhesion, the results being shown in Table 5. The results of the peel test were rated in 10 grades, based on visual confirmation of the proportion of the rubber left adhered to the PET film after peeling.

TABLE 5

|  | Adhesion performance |
| --- | --- |
| Example 4 | 9 |
| Example 5 | 10 |
| Example 6 | 10 |

The invention claimed is:

1. A process for producing a rubber-based composite material, comprising the steps of:
   forming, by reactive sputtering, a metallic compound adhesion film on a substrate consisting of a plastic to be mated with a rubber for constituting said composite material, and
   laminating a rubber composition on said adhesion film, and vulcanizing said rubber composition,
   wherein said reactive sputtering is carried out to form said adhesion film by using a first target and a second target, composed of different metallic components and provided in a chamber, while moving said substrate from the first target side toward the second target side in sputtering atmospheres formed by supplying a reactive gas comprising at least one element selected from the group consisting of oxygen, nitrogen, and carbon into said chamber and applying electric power simultaneously to said first and second targets, and
   wherein at least one target selected from the first target and the second target comprises zinc, silicon, cobalt, copper, silver, tantalum, or tungsten, or an alloy of these elements, and a composition of the adhesion film on the substrate side differs from a composition of the adhesion film on the rubber side.

2. A process for producing a rubber-based composite material of claim 1 wherein the thickness of said adhesion film is from 1 nm to 100 μm.

3. A process for producing a rubber-based composite material of claim 1, wherein the adhesion film has a gradient of metallic composition in a thickness direction of the adhesion film.

4. A process for producing a rubber-based composite material of claim 3, wherein, in the metallic composition, a metallic component comprising the first target decreases gradually from the substrate side toward the rubber side, and a metallic component comprising the second target increases gradually from the substrate side toward the rubber side, respectively, as viewed in the thickness direction of the adhesion film.

5. The process for producing a rubber-based composite material of claim 1, wherein the first target and the second target comprise zinc, silicon, cobalt, copper, silver, tantalum, or tungsten, or an alloy of these elements.

6. The process for producing a rubber-based composite material of claim 1, wherein the at least one target comprises silicon, tantalum, or tungsten, or an alloy of these elements.

7. A process for producing a rubber-based composite material, comprising the steps of:
forming, by reactive sputtering, a metallic compound adhesion film on a substrate consisting of a plastic to be mated with a rubber for constituting said composite material, and
laminating a rubber composition on said adhesion film, and vulcanizing said rubber composition,
wherein said reactive sputtering is carried out to form said adhesion film by using a first target and a second target, composed of different metallic components and provided respectively in a first compartment and a second compartment of a chamber comprising said first compartment and said second compartment communicated with each other through a communication port, while moving said substrate from the first target side toward the second target side through said communication port in sputtering atmospheres formed by supplying reactive gases comprising at least one element selected from the group consisting of oxygen, nitrogen, and carbon with different compositions respectively into said first and second compartments and applying electric power simultaneously to said first and second targets, and
wherein at least one target selected from the first target and the second target comprises zinc, silicon, cobalt, copper, silver, tantalum, or tungsten, or an alloy of these elements, and a composition of the adhesion film on the substrate side differs from a composition of the adhesion film on the rubber side.

8. A process for producing a rubber-based composite material of claim 7 wherein said sputtering is carried out by using plasma light emission detectors provided respectively in said first and second compartments, while controlling the quantities of said reactive gases supplied into said first and second compartments, by a plasma light emission monitor control for controlling the quantities of said reactive gases supplied into said first and second compartments so as to keep constant the light emission quantities detected by said plasma light emission detectors.

9. A process for producing a rubber-based composite material of claim 7 wherein said sputtering is carried out while controlling the quantities of said reactive gases supplied into said first and second compartments, by an impedance control for controlling the quantities of said reactive gases supplied into said first and second compartments according to the voltages between said first target or said second target and earth.

10. A process for producing a rubber-based composite material of claim 7 wherein said sputtering is carried out while exhausting the gases simultaneously through exhaust ports provided respectively for said first and second compartments.

11. A process for producing a rubber-based composite material of claim 7 wherein the thickness of said adhesion film is from 1 nm to 100 μm.

12. A process for producing a rubber-based composite material of claim 7, wherein the adhesion film has a gradient of composition of metallic components and components derived from the reactive gases in a thickness direction of the adhesion film.

13. A process for producing a rubber-based composite material of claim 12, wherein, in the composition, a metallic component comprising the first target and a component derived from the reactive gas supplied into the first compartment decreases gradually from the substrate side toward the rubber side, and a metallic component comprising the second target and a component derived from the reactive gas supplied into the second compartment increases gradually from the substrate side toward the rubber side, respectively, as viewed in the thickness direction of the adhesion film.

14. The process for producing a rubber-based composite material of claim 7, wherein the first target and the second target comprise zinc, silicon, cobalt, copper, silver, tantalum, or tungsten, or an alloy of these elements.

15. The process for producing a rubber-based composite material of claim 7, wherein the at least one target comprises silicon, tantalum, or tungsten, or an alloy of these elements.

16. A process for producing a rubber-based composite material, comprising the steps of:
forming, by reactive sputtering, a metallic compound adhesion film on a substrate consisting of a plastic to be mated with a rubber for constituting said composite material, and
laminating a rubber composition on said adhesion film, and vulcanizing said rubber composition,
wherein said reactive sputtering is carried out to form said adhesion film by using a first target and a second target, composed of different metallic components and provided in a chamber, while moving said substrate from the first target side toward the second target side in magnetron sputtering atmospheres formed by supplying a reactive gas comprising at least one element selected from the group consisting of oxygen, nitrogen, and carbon into said chamber and applying electric power to said first and second target on the basis of a dual cathode system, and
wherein at least one target selected from the first target and the second target comprises zinc, silicon, cobalt, copper, silver, tantalum, or tungsten, or an alloy of these elements, and a composition of the adhesion film on the substrate side differs from a composition of the adhesion film on the rubber side.

17. A process for producing a rubber-based composite material of claim 16 wherein the thickness of said adhesion film is from 1 nm to 100 μm.

18. A process for producing a rubber-based composite material of claim 16, wherein the adhesion film has a gradient of metallic composition in the thickness direction of the adhesion film.

19. A process for producing a rubber-based composite material of claim 18, wherein, in the metallic composition, a metallic component comprising the first target decreases gradually from the substrate side toward the rubber side, and a metallic component comprising the second target increases gradually from the substrate side toward the rubber side, respectively, as viewed in the thickness direction of the adhesion film.

20. The process for producing a rubber-based composite material of claim 16, wherein the first target and the second target comprise zinc, silicon, cobalt, copper, silver, tantalum, or tungsten, or an alloy of these elements.

21. The process for producing a rubber-based composite material of claim 16, wherein the at least one target comprises silicon, tantalum, or tungsten, or an alloy of these elements.

22. A process for producing a rubber-based composite material, comprising the steps of:

forming, by reactive sputtering, a metallic compound adhesion film containing a plurality of metallic elements on a substrate consisting of a plastic to be mated with a rubber for constituting said composite material, and laminating a rubber composition on said adhesion film, and vulcanizing said rubber composition, wherein said adhesion film is formed by said reactive sputtering which is carried out by using a plurality of targets, composed of metals or metallic compounds containing different metallic elements and provided in a chamber, while rotating said substrate on its own axis in sputtering atmospheres formed by supplying a reactive gas comprising at least one element selected from the group consisting of oxygen, nitrogen, and carbon into said chamber and applying electric power simultaneously to said targets, and wherein at least one target selected from the first target and the second target comprises zinc, silicon, cobalt, copper, silver, tantalum, or tungsten, or an alloy of these elements.

23. A process for producing a rubber-based composite material of claim 22 wherein the sputtering surfaces of said targets are inclined toward the surface, for formation of said adhesion film, of said substrate.

24. The process for producing a rubber-based composite material of claim 22, wherein the first target and the second target comprise zinc, silicon, cobalt, copper, silver, tantalum, or tungsten, or an alloy of these elements.

25. The process for producing a rubber-based composite material of claim 22, wherein the at least one target comprises silicon, tantalum, or tungsten, or an alloy of these elements.

* * * * *